US012615802B2

(12) United States Patent
George et al.

(10) Patent No.: US 12,615,802 B2
(45) Date of Patent: Apr. 28, 2026

(54) SQUARE ETCH PROFILES IN HETEROGENOUS MATERIALS OF INTEGRATED CIRCUIT DEVICES

(71) Applicant: Intel Corporation, Santa Clara, CA (US)

(72) Inventors: Mekha George, Hillsboro, OR (US); Seda Cekli, Portland, OR (US); Kilhyun Bang, Portland, OR (US); Krishna Ganesan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 557 days.

(21) Appl. No.: 17/957,580

(22) Filed: Sep. 30, 2022

(65) Prior Publication Data

US 2024/0113194 A1     Apr. 4, 2024

(51) Int. Cl.
| | |
|---|---|
| *H01L 29/423* | (2006.01) |
| *H01L 21/311* | (2006.01) |
| *H01L 27/088* | (2006.01) |
| *H01L 29/06* | (2006.01) |
| *H01L 29/786* | (2006.01) |
| *H10D 30/67* | (2025.01) |
| *H10D 62/10* | (2025.01) |
| *H10D 84/83* | (2025.01) |
| *H10P 50/28* | (2026.01) |

(52) U.S. Cl.
CPC ..... *H10D 30/6735* (2025.01); *H10D 30/6757* (2025.01); *H10D 62/121* (2025.01); *H10D 84/83* (2025.01); *H10P 50/283* (2026.01)

(58) Field of Classification Search
CPC .... H10D 30/014; H10D 30/024; H10D 30/43; H10D 30/62; H10D 30/6211; H10D 30/6212; H10D 30/6213; H10D 30/6735; H10D 30/6757; H10D 62/118; H10D 62/119; H10D 62/121; H10D 84/0158; H10D 84/0193; H10D 84/83; H10D 84/834; H10D 84/853; H01L 21/3065; H01L 21/30604; H01L 21/31116
See application file for complete search history.

(56) References Cited

U.S. PATENT DOCUMENTS

| | | | | |
|---|---|---|---|---|
| 9,660,050 | B1* | 5/2017 | Cai | H01L 21/28141 |
| 2021/0234021 | A1* | 7/2021 | Kuo | H10D 64/518 |
| 2022/0367456 | A1* | 11/2022 | Chen | H10D 84/038 |
| 2023/0060763 | A1* | 3/2023 | Hsiao | H10D 64/017 |
| 2024/0105787 | A1* | 3/2024 | Chang | H01L 21/28518 |

* cited by examiner

*Primary Examiner* — David C Spalla
(74) *Attorney, Agent, or Firm* — Essential Patents Group, LLP

(57) ABSTRACT

Materials and techniques for recessing heterogenous materials in integrated circuit (IC) dies. In an example, a method includes receiving a plurality of adjoining structures over a substrate. The structures comprise first and second outer sidewalls comprising a first material. An inner material and an intervening material is between the first and second outer sidewalls. The inner material is recessed with a first etch to a recess depth. A surface of the first or second outer sidewall is revealed to the recess depth by etching the intervening material with a second etch.

20 Claims, 11 Drawing Sheets

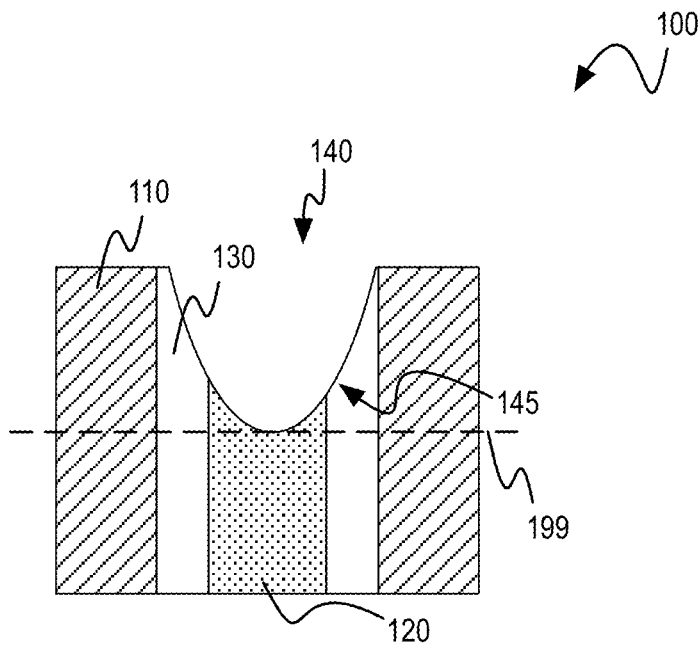
FIG. 1A
(Prior Art)
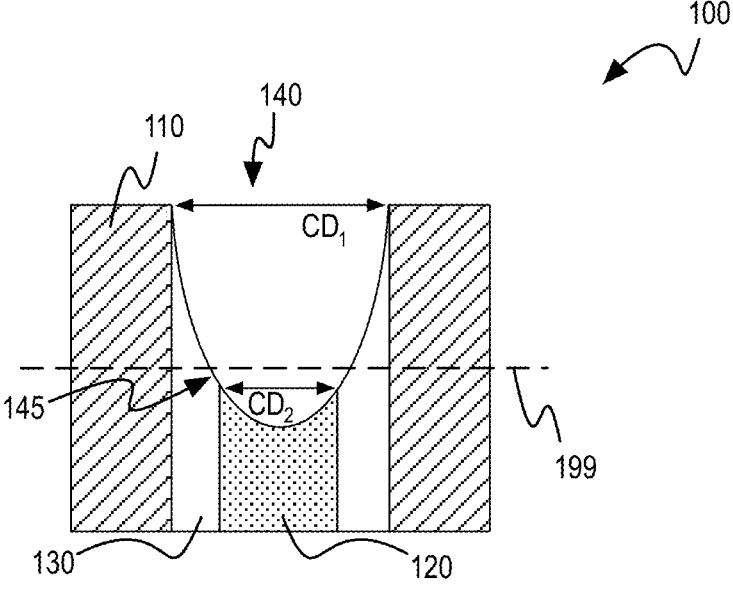
FIG. 1B
(Prior Art)
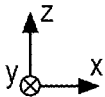

200

Receive a group of laterally
adjacent layers over a substrate    210

Etch an inner layer down to a
recessed surface at a recessed depth    220

Etch an intervening layer to the recessed depth    230

Finish    240

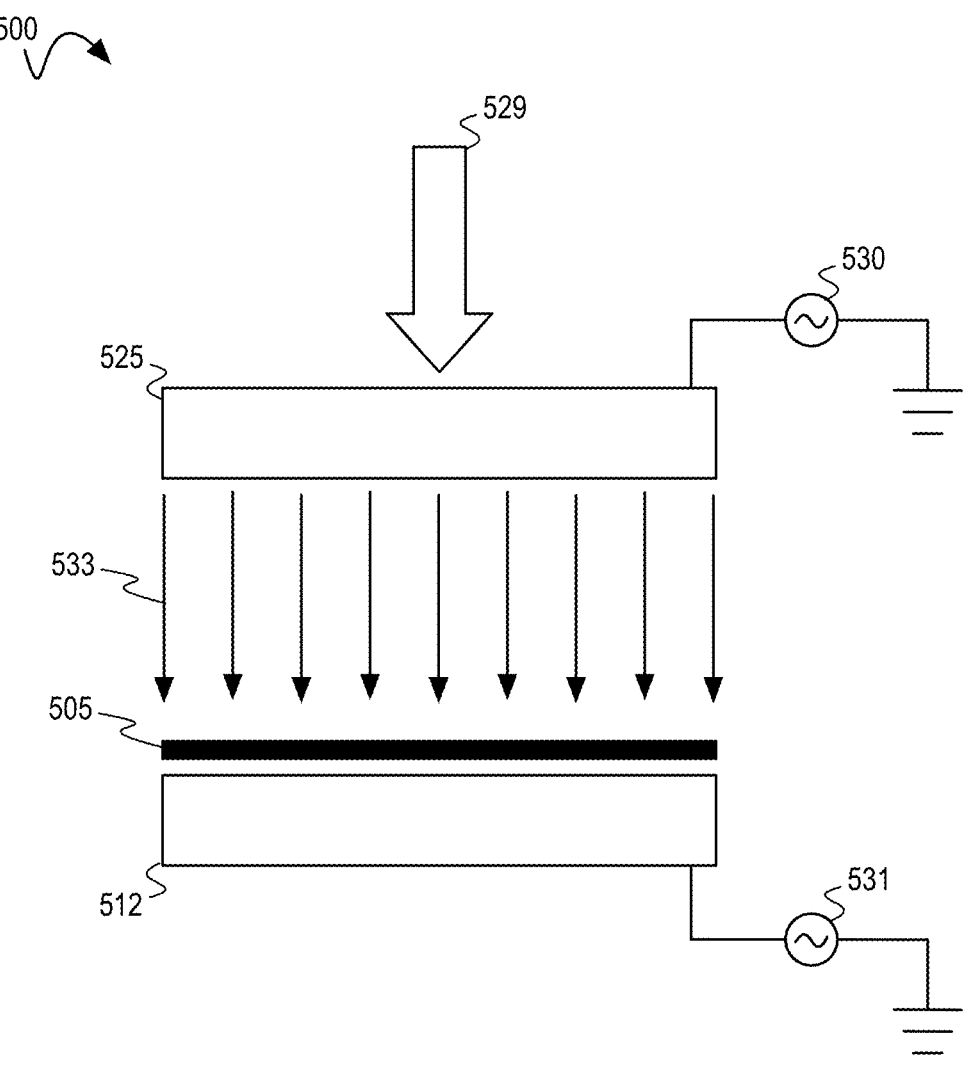
FIG. 5A

500

NH₃

C₄F₈

540

529

530

545

525

515

515

505    510

531

512

515

515

520

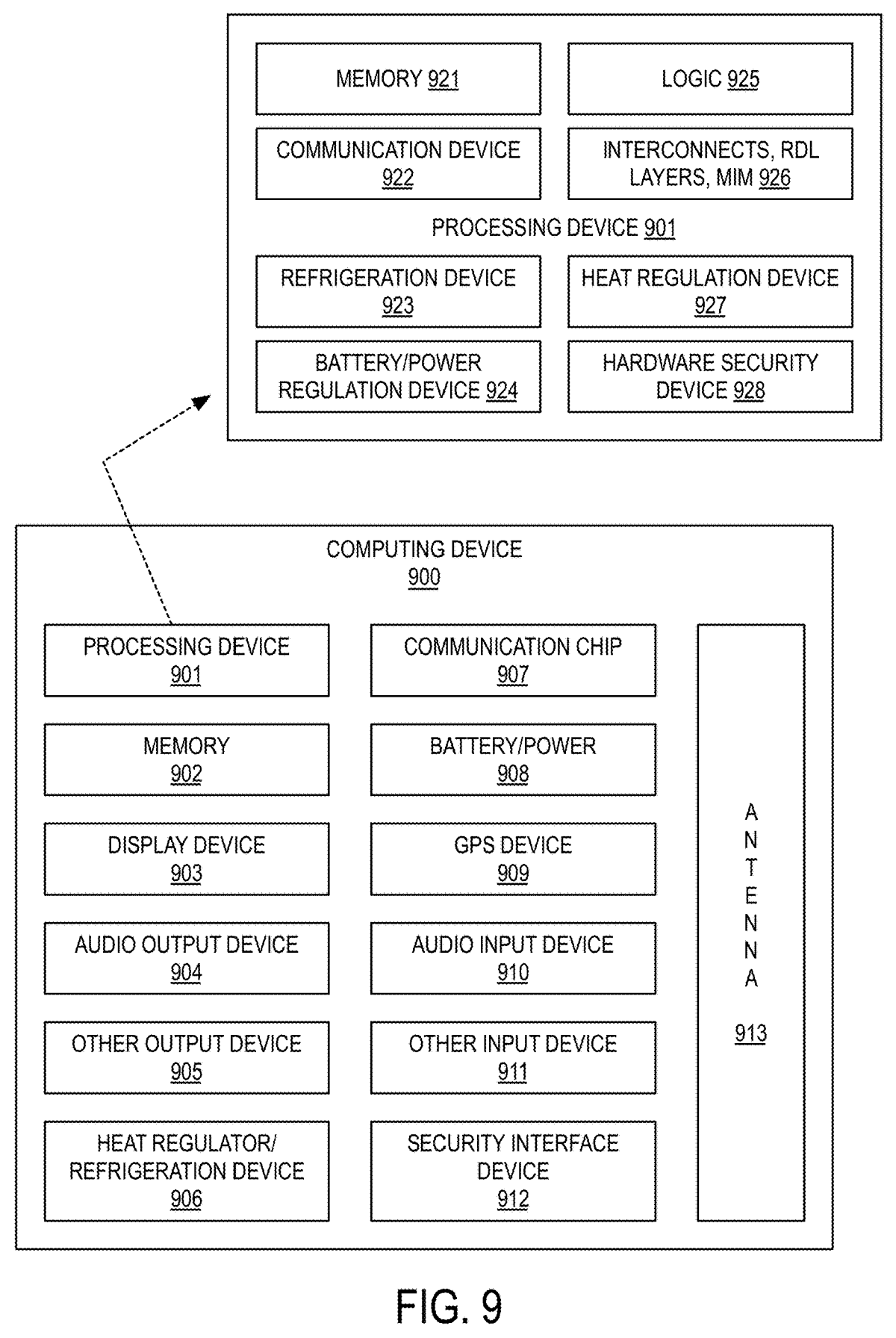

| MEMORY 921 | LOGIC 925 |
|---|---|
| COMMUNICATION DEVICE 922 | INTERCONNECTS, RDL LAYERS, MIM 926 |

PROCESSING DEVICE 901

| REFRIGERATION DEVICE 923 | HEAT REGULATION DEVICE 927 |
|---|---|
| BATTERY/POWER REGULATION DEVICE 924 | HARDWARE SECURITY DEVICE 928 |

COMPUTING DEVICE
900

| PROCESSING DEVICE 901 | COMMUNICATION CHIP 907 | |
|---|---|---|
| MEMORY 902 | BATTERY/POWER 908 | |
| DISPLAY DEVICE 903 | GPS DEVICE 909 | A N T E N N A 913 |
| AUDIO OUTPUT DEVICE 904 | AUDIO INPUT DEVICE 910 | |
| OTHER OUTPUT DEVICE 905 | OTHER INPUT DEVICE 911 | |
| HEAT REGULATOR/ REFRIGERATION DEVICE 906 | SECURITY INTERFACE DEVICE 912 | |

FIG. 9

SQUARE ETCH PROFILES IN HETEROGENOUS MATERIALS OF INTEGRATED CIRCUIT DEVICES

BACKGROUND

To improve system operation and reduce cost, the semiconductor industry continually seeks to shrink feature sizes while delivering enhanced transistor performance. However, feature scaling is becoming more challenging as features transition from nano-scale to atomic scale while keeping process variability (within wafer, wafer to wafer, chamber to chamber, etc.) in control. With these restrictions, an ability to control the etch front during an anisotropic etch process is increasingly important.

A recess is typically etched using a single etch process. For applications where an underlying etch stop layer is exposed, any arbitrarily shaped etch front may advance until flattened by stop layer's etch resistance. However, the etch front for a hanging etch, which does not expose an underlying etch stop material layer, is more difficult to control both with respect to a target depth and a shape of the etch profile. In the absence of a stop layer, an over-etch offering selectivity to the stop layer material cannot be relied upon to set the recess depth or to flatten out the etch front at the recess depth.

The control issue particular to etching a hanging recess are all the more difficult when different materials are to be etched to the same target depth. FIG. 1A shows a profile in an integrated circuit (IC) die 100 with multiple stripes of materials that include outer materials 110. An inner material 120 is between outer materials 110 that are of an etch-resistant composition. Intervening materials 130 are between inner material 120 and each of the outer materials 110. A recess 140 has been etched with a curved etch front 145. A point on etch front 145 within inner material 120 is at a target depth 199 while a sidewall of outer materials 110 remain covered by increasing thicknesses of intervening materials 130 as etch front 145 tapers toward the lower depths of recess 140. FIG. 1B shows the etch front 145 advancing in an effort to expose a sidewall of outer material 110. As shown, a portion of the recess 140 has become deeper than target etch depth 199. The curved etch front 145 achieves a wider profile top width $CD_1$, but a much narrower profile bottom width $CD_2$ near target depth 199. FIG. 1C graphically illustrates typical differences between top and bottom widths $CD_1$, $CD_2$ of a hanging recess, resulting from a conventional etch process. As shown, narrow bottom width $CD_2$ is less than half of the wider top width $CD_1$, which indicates sidewalls of outer material 110 are not exposed near the target etch depth. The differing top and bottom widths $CD_1$, $CD_2$ can induce process variability and can hinder subsequent processing. For example, a tapered etch profile can result in fill and contact defects, which degrade both yield and performance of an IC device.

Improved etch techniques, materials, and structures would advantageously improve performance and/or reduce process variability in IC devices.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings:

FIGS. 1A, 1B, and 1C illustrate cross-sectional profile and graphical views of etch profiles in heterogenous materials of an integrated circuit (IC) die, in accordance with convention;

FIGS. 5A and 5B illustrate an exemplary reactive processing chamber schematically and in a partial cross-sectional view, in accordance with some embodiments;

FIG. 9 is a block diagram of an example computing device, in accordance with some embodiments.

DETAILED DESCRIPTION

Figure 1C:
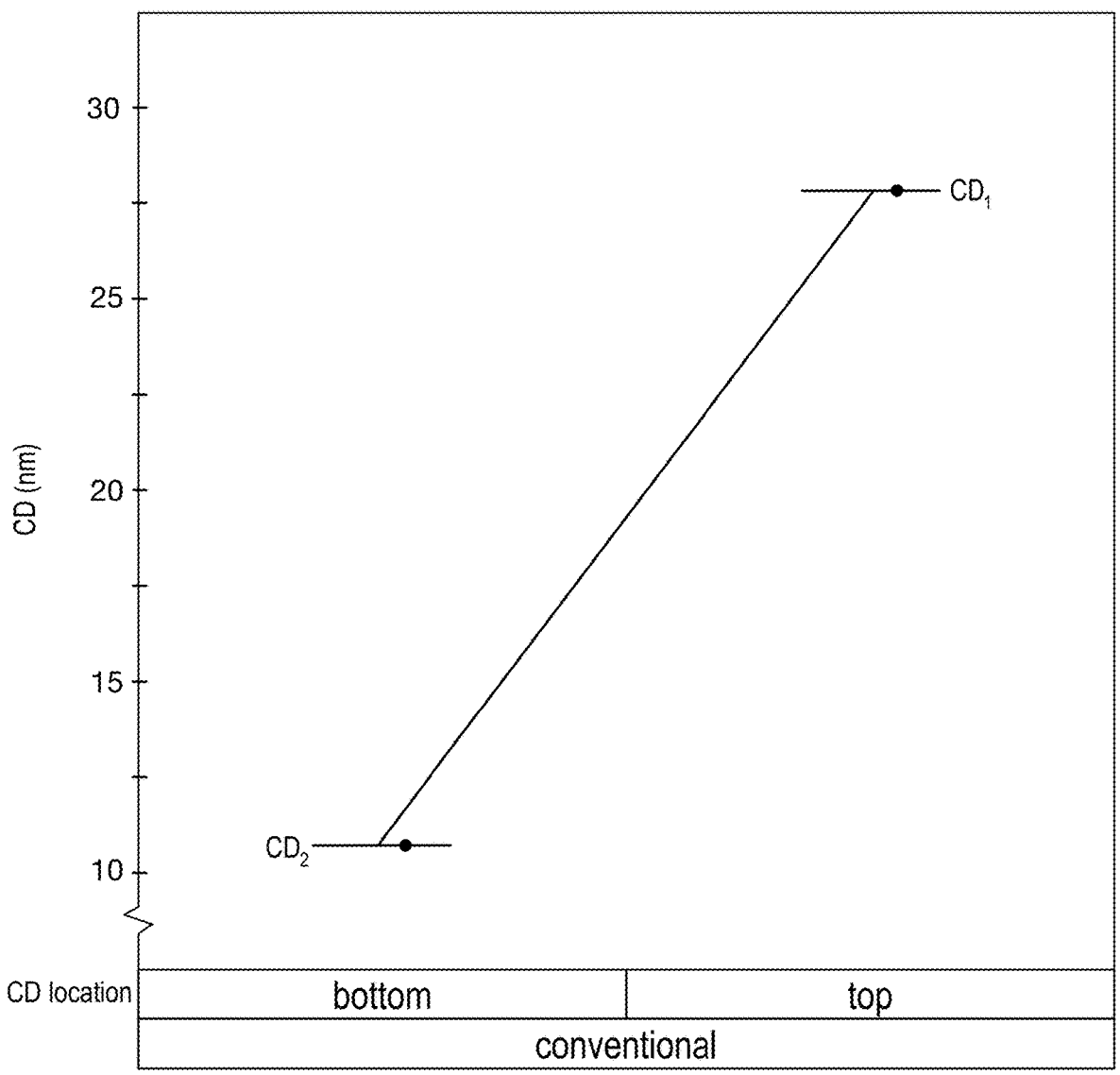

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and recitations of "top," "bottom," "above," and "below" refer to relative positions in the z-dimension with the usual meaning. However, embodiments are not necessarily limited to the orientations or configurations illustrated in the figure.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed to improve the recessing of heterogenous structures in integrated circuit (IC) dies. Both the recess depth and the etch profile may be well controlled by using a combination of etches. A square-profiled hanging recess with any desired depth can be etched into multiple adjacent materials of differing composition and/or physical proximity to adjacent etch-resistant structures. These techniques can be used for, but are not limited to, defining transistor features. For example, these techniques can be used for applications where multiple dielectric materials of differing composition are present adjacent to a sidewall of a metal, such as one or more gate electrode materials. In some embodiments, a first material includes an oxide (e.g., a silicon oxide, $Si_xO_y$ (such as $SiO_2$)), and a second material includes a nitride (e.g., a silicon nitride, $Si_xN_y$ (such as $Si_3N_4$)). In some embodiments, a first material has a first composition, and an adjacent spacer material has a second composition that is at least slightly different than the first composition.

A first etch process may define a target depth of a recess into a first material. The first etch process may be supplemented or augmented with a second etch process that etches a second material to be removed more rapidly than the first material. While this multi-process etch may be practiced in any context, in advantageous embodiments the multi-process etch is applied to fabricate a hanging recess that does not expose an underlying etch stop material layer. In the absence of a stop layer, an over etch offering selectivity to a stop layer cannot be relied upon to define the recess depth or otherwise control the etch front.

As described further below, the first etch process may be an atomic layer etch (ALE) process, for example, offering a precisely controlled removal rate according to cyclical self-limiting half reactions. The second etch process may be a continuous/non-cyclical etch that squares out the recess profile, for example between two etch resistant materials. One or both processes may use a well-controlled plasma etch to form a hanging feature with a desired square profile at a particular recess depth, and both the plasma composition and distribution may be controlled to enhance or hinder selectivity. Plasma composition may be controlled by material selection, for example, of reactant gases, as well as other process parameters. A plasma distribution may include temporal and regional variations in plasma energies and composition within a processing chamber. The plasma distribution may be manipulated by various process parameters as well, including plasma excitation (e.g., voltage and frequency) and vacuum.

Figure 2:
FIG. 2 is a flow chart of methods for etching square hanging-recess profiles into heterogenous materials of an IC die, in accordance with some embodiments.

FIG. 2 is a flow chart of methods 200 for etching square hanging-recess profiles into heterogenous materials of an IC die, in accordance with some embodiments. FIG. 2 shows an example sequence, but the operations can be done in other orders as well, and some operations may be omitted as optional. Some operations can also be performed multiple times before other operations are performed. Some operations may be included within other operations.

Methods 200 generally entail a multi-operation etch. A first etch process is tuned for at least an inner material and defines a recess depth stopping within the inner material. Control of plasma distribution may enable adjustment of the recess depth and shape, e.g., optimizing tapering in preparation for a subsequent etch. Such tapering may assist in making the first etch process self-limiting as the etch progresses vertically. A second etch process is tuned for at least an intervening material (e.g., between the inner material and a sidewall of a material resistant to etch). This tuning, e.g., of plasma composition, may be by developing more intervening material—than inner material—etching species. The second etch is to reveal a sidewall surface of an etch-resistant material advantageously to the full recess depth. Accordingly, a first penetrating etch and a second lateral etch can be combined to both precisely control a depth of a recess into two materials of different composition and to clear the sidewalls of any intervening material down to the recess depth. In some embodiments, an inner material has only one adjacent intervening material between two sidewalls of an etch resistant material. In other embodiments, an inner material has adjacent intervening materials on either side and between the two sidewalls of etch resistant material. In some embodiments, an inner material has more than one intervening material between the inner material and at least one of the sidewalls of an etch-resistant material.

Figure 3A:
FIGS. 3A, 3B, and 3C illustrate cross-sectional profile views of a square-profiled hanging recess in heterogenous materials of an IC die, at various stages of processing, in accordance with some embodiments.
Figure 3A:
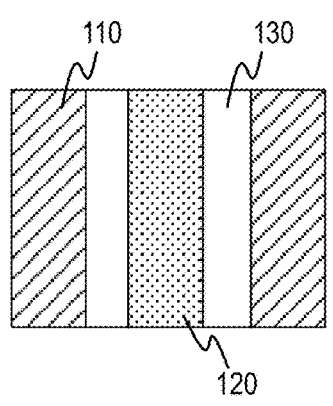
Figure 3B:
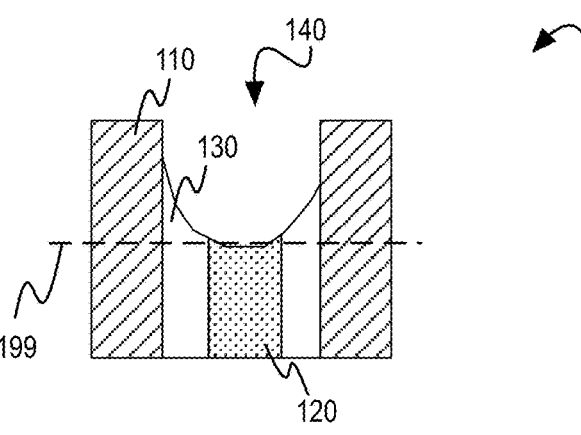
Figure 3C:
Figure 3C:
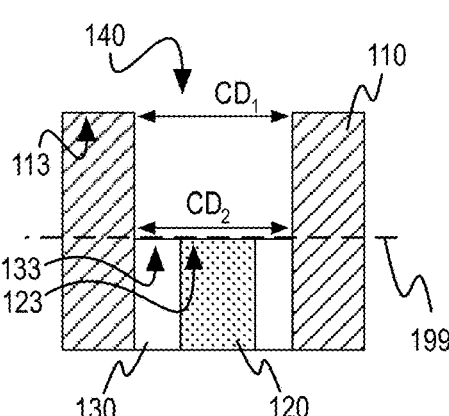

FIGS. 3A, 3B, and 3C illustrate cross-sectional profile views of a square-profiled recess 140 formed in heterogenous materials, at various stages of processing, in accordance with some embodiments. FIGS. 3A-3C show a progression of structures where inner material 120 is etched down, revealing upper surface 123 of inner material 120, and intervening materials 130 are etched back, laterally and down, revealing surfaces of outer materials 110 and upper surfaces 133 of intervening materials 130. Recess 140, between outer materials 110 and over inner material 120 and intervening materials 130, has a substantially square profile.

Returning to FIG. 2, methods 200 begin at operation 210 with the receipt of a substrate with a group of adjoining structures over the substrate. The stripes of differing materials may be part of a series with some or all of the materials recurring in the series. The stripes of differing materials may be substantially parallel with each other into the page (e.g., y-dimension) as well as along the z-dimension. Compositional differences between the materials will be described below.

FIG. 3A shows a received IC die 300 with heterogenous materials, including inner material 120 and intervening materials 130 between substantially parallel, etch-resistant outer materials 110. Outer, inner, and intervening materials 110, 120, 130 are coplanar at an upper surface of IC die 300. Other structures (not shown) of IC die 300, such as transistors, metallization, and insulators, may form a substrate below outer, inner, and intervening materials 110, 120, 130. Although outer materials 110 bracket inner and intervening materials 120, 130, IC die 300 may include other structures adjacent outer materials 110 on one or both sides of inner and intervening materials 120, 130. In some such embodiments, a sidewall of one or both materials 110 opposite inner and intervening materials 120, 130 defines an outer sidewall for other, adjacent intervening materials 120, 130.

At operation 220 of FIG. 2, an etch of the inner material with a first etch process reveals a recessed surface at a recess depth. A precisely controlled penetrating etch down into the inner material may define the depth of the recess. In some embodiments, a cyclical etch is performed at operation 220. For example, in some embodiments an ALE is performed. In some such embodiments, a capacitively coupled plasma (CCP) ALE with a radio-frequency (RF) power supply is performed at operation 220.

The cyclical etch process may include two phases of chemical half reactions: a first phase that modifies the top atomic layer of the inner material, and a second phase that removes the chemically-modified atomic layer selectively to an unmodified atomic layer. For example, an ALE of an inner material including silicon and oxygen may reveal a recessed surface by alternating reactions with fluorocarbon plasma (e.g., from $C_xF_y$, such as $C_4F_8$, or a similar precursor) and an energetic plasma species (e.g., including argon ions or similar). Each phase of one cycle may be self-limiting with a half-reaction with a reactive species ending when all of the surface reactive sites are consumed. Managing the number of cycles performed therefore enables the precise control of the recess depth. Such precise control of etch depth however is difficult to apply uniformly across materials of different chemical composition. For example, as shown in FIG. 3B, recess 140 has a tapered etch profile with the etch front advancing to the target depth 199 only within inner material 120 that is of the chemical composition for which the first etch process was tuned. Hence, inner material 120 is at target depth 199 below the height of outer materials 110, but portions of the sidewall surfaces of outer materials 110 above target depth 199 remain covered by intervening materials 130, which for example have a composition that is etched more slowly by the first etch process.

Returning to FIG. 2, methods 200 continue at operation 230 the intervening material is etched with a second process, for example to reveal a sidewall surface of an etch resistant material to the recess depth. The second etch process may be advantageously selective to the chemical composition of an intervening material. Such selectivity may maintain the recess depth of the inner material while removing any and all intervening material at and above the recess depth. In some embodiments, the second etch process is a continuous/non-cyclical etch performed at operation 230. In some such embodiments, a CCP etch with a RF power supply is performed at operation 230.

Different precursor gases may be used for the two-etch process performed at operations 220 and 230. In some embodiments, the processes use different precursor gases, but occur in a same processing chamber. In some embodiments, a precursor gas used in the etch process performed at operation 230 includes hydrogen. The hydrogen precursor may be absent from the etch process performed at operation 220. In some embodiments, a fluorine precursor gas is utilized in both the etch process performed at operation 220 and the etch process performed at operation 230. The fluorine precursor gas may be the same or varied between operations 220 and 230. The etch process performed at operation 230 may include a hydrofluorocarbon precursor gas (e.g., $C_xH_yF_z$).

In some embodiments, the etch process performed at operation 230 includes an unconventionally hydrogen-rich hydrofluorocarbon gas mixture, for example, for tuning an etch selectivity to certain materials, such as a nitride (e.g., $Si_xN_y$). The relative flow rates of the precursor gases may be adjusted to tune the selectivity of the etch process, e.g., to be unconventionally hydrogen-rich. Precursor gas delivery may be tuned by, e.g., adjusting one or more pressures within a processing chamber, such as precursor gas inlet pressures or a chamber outlet vacuum.

Optimizing an etch process, e.g., an etch selectivity, performed at operation 230 may include optimizing an ion energy of the plasma. Such optimization may be by tuning excitation parameters of power sources, for example, voltages and frequencies. Multiple power sources (e.g., nearer and further from where precursor gases are delivered and where the materials to be etched are positioned) may be used and controlled separately.

At operation 240 of methods 200, recess processing may be complete or may be, e.g., repeated. Further processing of the substrate, e.g., an IC die, may continue, for example, with the deposition of materials into the substantially square-profiled recess.

FIG. 3C illustrates a cross-sectional view of a square-profiled hanging recess 140 in heterogenous materials of an IC die 300, in accordance with some embodiments, e.g., after performing the operations of methods 200. Upper surfaces 123, 133 of inner material 120 and intervening materials 130 are substantially coplanar at target depth 199 below and between upper surfaces 113 of etch-resistant outer materials 110. In contrast to the tapered U-shape profiles of FIGS. 1A-1C, the square profile of FIG. 3C provides a well-controlled hanging recess that can facilitate subsequent processing. Relative to uneven surfaces of varying heights or depths, the substantially coplanar upper surfaces 123, 133 of inner material 120 and intervening materials 130 may provide a superior substrate for overlying layers or other structures (not depicted). Subsequent processing, e.g., photolithography or deposition of materials, may benefit from a substantially planar substrate. Lateral width of recess 140 at the upper surfaces 113 of outer materials 110 (e.g., top $CD_1$) is not more than 30% larger than the lateral recess width at the upper surfaces 123, 133 of inner material 120 and intervening materials 130 (e.g., bottom $CD_2$). In some embodiments, top and bottom widths $CD_1$, $CD_2$ are equal or substantially equal.

Outer, inner, and intervening materials 110, 120, 130 may all be insulators, e.g., over transistor structures. In some embodiments, outer materials 110 and/or inner material 120 include conductive material. In some such embodiments, outer materials 110 and/or inner material 120 are predominantly metal. In some embodiments, outer materials 110 and/or inner material 120 are gate electrodes (or portions of gate electrodes, or gate contacts). As such, one or both of outer materials 110 and/or inner material 120 may include tungsten, platinum, titanium, copper, aluminum, etc. In some alternative embodiments, outer materials 110 include, or are predominantly, a semiconductor material. For example, outer materials 110 and/or inner material 120 may include epitaxial material that has been grown, e.g., laterally from an end portion of transistor channel regions. In other alternative embodiments, outer materials 110 may be predominantly of an insulator, e.g., a dielectric material, or a metal but include a semiconductor material, for example, transistor channel regions. In some embodiments, outer materials 110 and/or inner material 120 are a sacrificial material and may later be removed. In some embodiments, inner material 120 includes a material differing from the material(s) of outer materials 110. In some embodiments, outer materials 110, e.g., left and right outer materials 110, may include differing materials.

In some embodiments, inner material 120 and a single intervening material 130 are between left and right outer materials 110. In some embodiments, as in the example illustrated, intervening materials 130 are on both sides of inner material 120 and between left and right outer materials 110. In some embodiments, intervening materials 130, e.g., left and right intervening materials 130, may include differing materials.

Intervening materials 130 include a material different from the etch-resistant outer materials 110 and from inner material 120. In some embodiments, inner material 120 includes predominantly silicon and oxygen (e.g., $SiO_2$). In some embodiments, intervening materials 130 also include at least one of silicon and oxygen. In some embodiments, intervening materials 130 include more carbon and/or more nitrogen than inner material 120, e.g., silicon oxynitride, silicon carbonitride, silicon carbide, etc. In some such embodiments, intervening materials 130 provide protection, e.g., chemical protection, for outer materials 110. In some such and other embodiments, intervening materials 130 provide improved device performance, e.g., by improved dielectric properties. In some embodiments, intervening materials 130 are predominantly silicon and nitrogen (e.g., silicon nitride). In some embodiments, intervening materials 130 are predominantly silicon and carbon (e.g., silicon carbide). Compositional differences between intervening materials 130 and inner material 120 may provide any number of manufacturing and/or device performance advantages.

Figure 4:
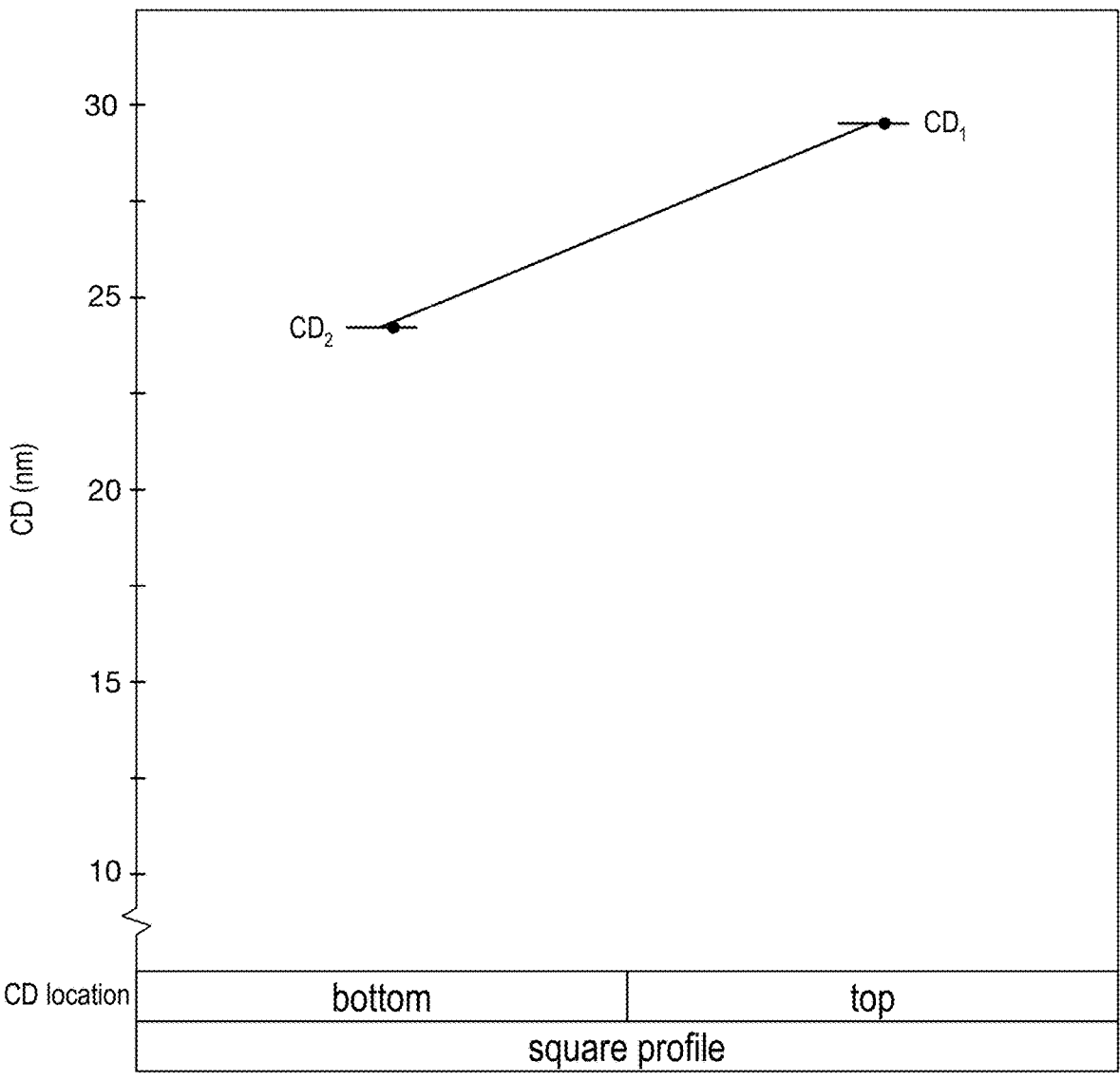
FIG. 4 is a graph of the top and bottom widths of a hanging recess within heterogenous materials, in accordance with some embodiments.

FIG. 4 is a graph of top and bottom widths $CD_1$, $CD_2$ of a hanging recess within heterogenous materials, for example etched with a multi-etch process as described. $CD_1$, $CD_2$ show more consistency and less process variation relative to the graph in FIG. 1C. Bottom $CD_2$ differs from top $CD_1$ by less than 6 nm (i.e., <20% of $CD_1$). In some embodiments, bottom $CD_2$ is within 15% of top $CD_1$.

In contrast to the data plotted in FIG. 1C (and the profiles illustrated in FIGS. 1A and 1B), FIG. 4 describes outer materials 110 substantially uncovered by other materials, e.g., intervening materials 130, above target depth 199. Such exposed outer materials 110 may have many benefits. In some embodiments, one or both of outer materials 110 are gate electrodes (or portions of gate electrodes, or gate contacts) whose electrical contact benefit from the squared profile and removed intervening materials 130.

Figure 5B:
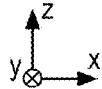

FIGS. 5A and 5B illustrate an exemplary reactive plasma processing chamber (i.e., reactor) 500, in accordance with some embodiments. FIG. 5A shows a simplified schematic view of processing chamber 500. FIG. 5B shows processing chamber 500 in a partial cross-sectional view. Processing chamber 500 may be any appropriate reactor for etching microelectronics devices, such as a vacuum dry etch reactor, e.g., for practicing methods 200. Various components of processing chamber 500 are symbolically illustrated without illustrating the exact shape, size, location or other details of the various components. In the illustrated example, reactive processing chamber 500 is an etch process chamber, reactor, or module. Processing chamber 500 and the associated hardware may be of one or more process-compatible structural materials (e.g., aluminum, stainless steel, etc.).

As shown in the schematic view of FIG. 5A, processing chamber 500 includes at least one electrode and power source, e.g., upper electrode 525 and upper power source 530, to develop a plasma 533 for processing a workpiece 505. Workpiece 505 is coupled to a workpiece support assembly 512. Gases are introduced into processing chamber 500 via a gas delivery line 529 for excitation into plasma 533 by one or more electrodes. In some embodiments, workpiece support assembly 512 includes a lower electrode coupled to workpiece 505. In some embodiments, processing chamber 500 does not utilize multiple electrodes.

Multiple electrodes may allow for improved development and control of plasma 533. Such control may also be improved by strategically locating the electrodes, e.g., above and below workpiece 505. Such control may also be improved by separately controlling the electrodes, e.g., with separate power sources. For example, upper electrode 525 is electrically coupled to an upper power source 530, and workpiece support assembly 512 (and its lower electrode) is electrically coupled to a lower power source 531. Upper and lower power sources 530, 531 may be any source, such as, but not limited to a RF, direct current (DC), or microwave (MW) generator. For example, in some embodiments, one of power sources 530, 531 are a DC source. In some embodiments, processing chamber 500 employs a CCP etch, and one or both of power sources 530, 531 are an RF source. In some embodiments, workpiece support assembly 512 does not include a lower power source, and workpiece 505 is electrically insulated from workpiece support assembly 512. Each (or a single) power supply may energize multiple electrodes.

Discrete and separately controllable upper and lower power sources 530, 531 allow for adjusting, e.g., a plasma composition and a plasma distribution, for example, by separately adjusting the respective voltages and frequencies of power sources 530, 531. In some embodiments, both of power sources 530, 531 are RF sources, but at different operating frequencies. In some such embodiments, lower power source 531 operates at a lower excitation frequency, e.g., in the range of 20-50 MHz, and upper power source 530 operates at a higher excitation frequency, e.g., in the range of 50-100 MHz. A higher frequency excitation near gas delivery line 529 may improve plasma formation. A lower frequency excitation of or near workpiece 505 may aid in control of a distribution of plasma 533 within processing chamber 500.

As illustrated in FIG. 5B, processing chamber 500 includes a chamber body 515 with a lid assembly including upper electrode 525 that is electrically coupled to upper power source 530. Upper electrode 525 is located at an upper end of chamber body 515, and workpiece support assembly 512 is at least partially disposed within a lower end of chamber body 515. Chamber body 515 may accommodate a slit valve opening to provide access to a workpiece processing region 510 where workpiece 505 is to reside during processing. The slit valve opening may be opened and closed to allow access to workpiece processing region 510, for example by handling robot (not shown). Workpiece 505 (e.g., a wafer including microelectronic device features) rests over a platen region of workpiece support assembly 512. Processing chamber 500 may include one or more heaters, for example, to adjust the temperature of workpiece 505 or reactive gases. Multiple heaters may be positioned in located separately in processing chamber 500, for example, above and below, or on multiple sides of workpiece 505. Such multizone heaters may also be controlled separately, e.g., to allow for a uniform etch across workpiece 505.

Processing chamber 500 is coupled to source gases 540 that are to be introduced into a remote plasma region 545 by gas delivery line 529. In the illustrated example, source gases 540 include a hydrogen-containing precursor (e.g., $NH_3$) and a fluorocarbon precursor (e.g., $C_4F_8$). Source gases 540 may further include other gases, such as argon, or other reactive gases. Source gases 540 are excited into a plasma by at least upper power source 530. In this example, remote plasma region 545 is contained within a lid assembly with the hydrogen source gas and fluorocarbon source gas to both flow into a remote plasma region 545. Reactive plasma effluents (e.g., chemical radicals) created within remote plasma region 545 are then to travel into workpiece processing region 510 where they interact with workpiece 505 (e.g., etching microelectronic features thereon). Processing chamber 500 may be pumped down below atmospheric pressure by a vacuum system 520 that includes a vacuum pump stack downstream of a throttle valve to regulate flow of gases through remote plasma region 545 and workpiece processing region 510. In some embodiments, the pressure in processing chamber 500 is 20 mTorr. The vacuum may be reduced further, for example, to further enhance gas flow. In some embodiments, the pressure in processing chamber 500 is 18 mTorr.

Figure 6A:
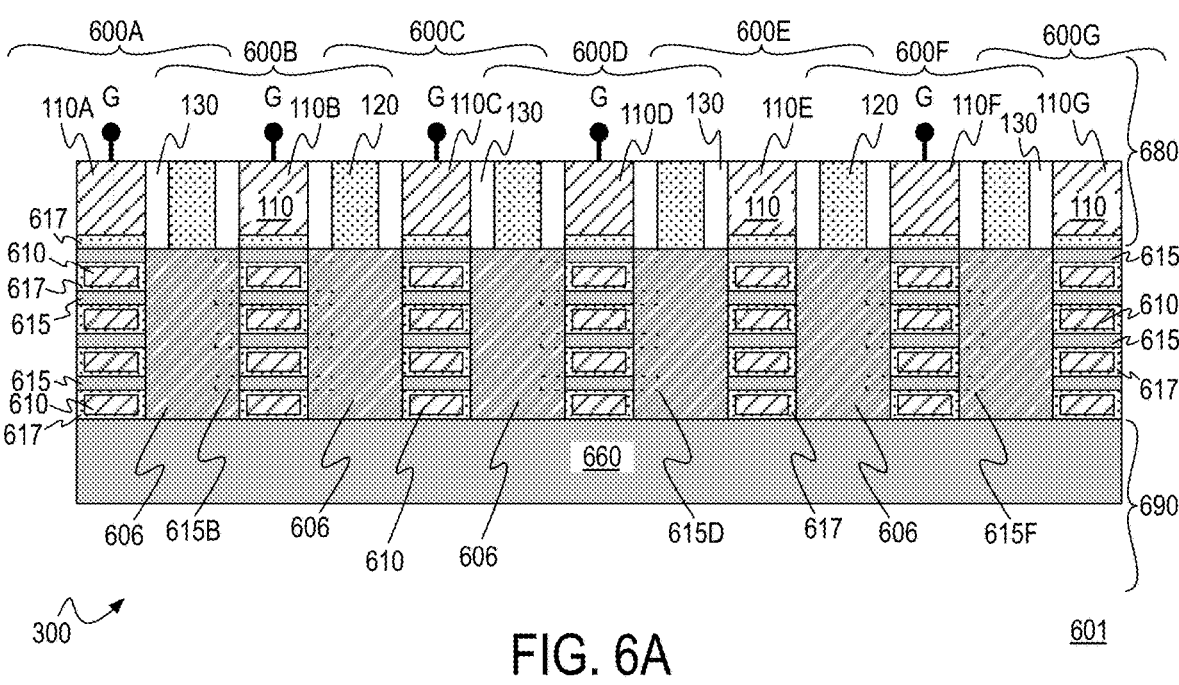
FIGS. 6A and 6B illustrate cross-sectional profile views of square-profiled hanging recesses in heterogenous materials over transistor structures, at various stages of manufacture, in accordance with some embodiments.
Figure 6B:
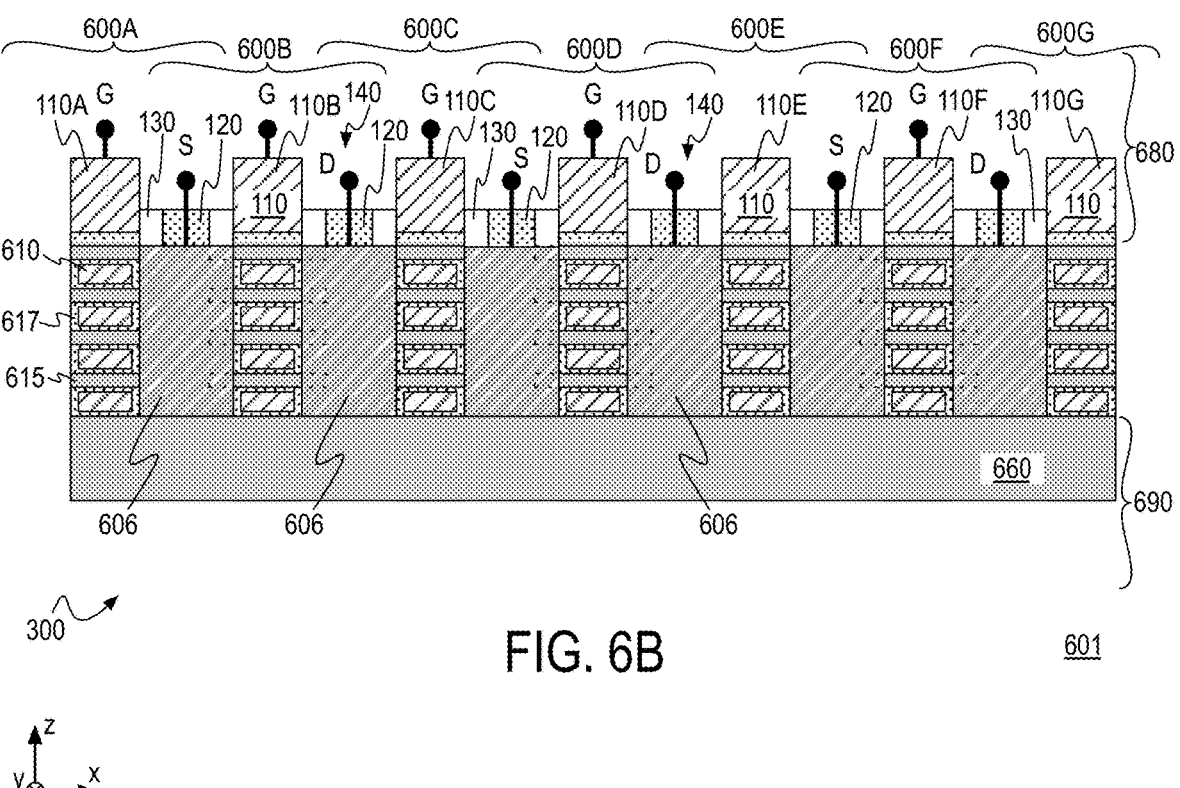

FIGS. 6A and 6B illustrate cross-sectional profile views of IC die 300 with square-profiled hanging recesses in heterogenous materials over transistor structures 600, at various stages of manufacture, in accordance with some embodiments. FIG. 6A shows IC die 300 including heterogenous materials (e.g., outer materials 110, inner materials 120, and intervening materials 130) over transistor structures 600 (e.g., transistor structures 600A-600G). Outer materials 110A-110G are outer materials 110 as discussed herein. Transistor structures 600 are gate-all-around (GAA) transistor structures, each having a plurality of stacked channel regions 615. The cross-sectional profile view of FIG. 6A passes through a transverse length of gate electrodes 610 and passes through a longitudinal length of channel regions 615. Source or drain regions 606 are electrically and physically coupled to opposite sides of channel regions 615. In some embodiments, source or drain regions 606 may be referred to interchangeably. IC die 300 may include one or more front-side metallization levels 680 over a "top" or "front" side of transistor structures 600, and one or more back-side metallization levels 690 over (under) a "bottom" or "back" side of transistor structures 600. IC die 300 is coupled to a substrate 601 and coupled to a power supply through substrate 601.

In the example of FIG. 6A, outer materials 110 and inner materials 120 may have any of the compositions described above. In some embodiments, outer materials 110 are contiguous with or part of gate electrodes 610, e.g., as part of a gate structure that also includes a gate dielectric 617.

Channel regions 615 may be non-planar bodies of semiconductor material patterned from a fin in a front (top) side of a substrate material layer. Channel regions 615 may be nanowires or nanoribbons. In some embodiments, channel regions 615 are crystalline semiconductor. In some such embodiments, the crystalline semiconductor may be advantageously substantially monocrystalline, for example, a group IV semiconductor material or a Group III-V alloy semiconductor material. Alternative polycrystalline or amorphous embodiments may instead include semiconducting metal oxides, such as indium gallium zinc oxide (IGZO).

Transistor structures 600 include a sub-channel material 660. Sub-channel material 660 is under the stack of channel regions 615, under gate electrodes 610, and may be a base of a fin, for example, from which channel regions 615 were formed. As such, sub-channel material 660 may have a composition and/or microstructure similar to channel regions 615.

Transistor structures 600 include a gate dielectric 617 cladding channel regions 615 to provide GAA control of channel conductivity. Gate dielectric 617 may be any dielectric material(s) known to be suitable as an insulator of a gate electrode, such as, but not limited to $SiO_2$, $SiON_x$. In some exemplary embodiments, gate dielectric 617 includes a high-k material. In some embodiments, gate dielectric 617 and intervening materials 130 are predominantly the same material.

The gate structures of transistor structures 600 may have a single monolithic body including gate electrode 610 and outer material 110. However, gate electrode 610 may include a workfunction metal over the gate dielectric 617, and a compositionally distinct fill metal. Outer materials 110 may include one or more of these metals.

Although a portion of transistor structure 600A to the left is not shown, transistor structures 600A, 600B may be similar. For example, outer material 110A is contiguous with or part of gate electrode 610 of transistor structure 600A, and outer material 110B is contiguous with, or part of, gate electrode 610 of transistor structure 600B. In the examples of transistor structures 600A, 600B, source or drain regions 606 include epitaxial material that has been grown, for example laterally from an end portion of channel regions 615 coplanar with, or extending from, a surface of gate dielectric 617, e.g., 615B drawn in dashed line. Transistor structures 600A, 600B share a source or drain regions 606 between the gate structures of transistor structures 600A, 600B.

Transistor structures 600B, 600C and other adjacent transistor structures 600 similarly share a source or drain regions 606 between the gate structures of respective transistor structures 600B, 600C, etc.

In alternative embodiments, source or drain regions 606 need not be epitaxial material. Source or drain regions 606 also need not be merged into a unitary body, in which case cantilevered source/drain nanowire ends (e.g., 615B, 615D, or 615F) may be individually contacted by a terminal contact metal. In some embodiments, back-side metallization levels 690 include a back-side source and drain metallization that is in contact with source or drain regions 606. In some embodiments, front-side metallization levels 680 may include a front-side source and/or drain contact that is similarly in contact with one or more of source or drain regions 606. Likewise, front-side metallization levels 680 and/or back-side metallization levels 690 may further include a contact to gate electrode 610.

FIG. 6B shows IC die 300 including square-profiled recesses 140 in heterogenous materials over transistor structures 600, in accordance with some embodiments. Inner materials 120 and intervening materials 130 are over source or drain regions 606, between and recessed down from the height of outer materials 110. Source and drain regions 606 of transistor structure 600B, etc., are coupled and electrically connected to front-side metallization levels 680 (e.g., through recesses 140). Electrical connections may include metallization, such as via connections.

Figure 7:
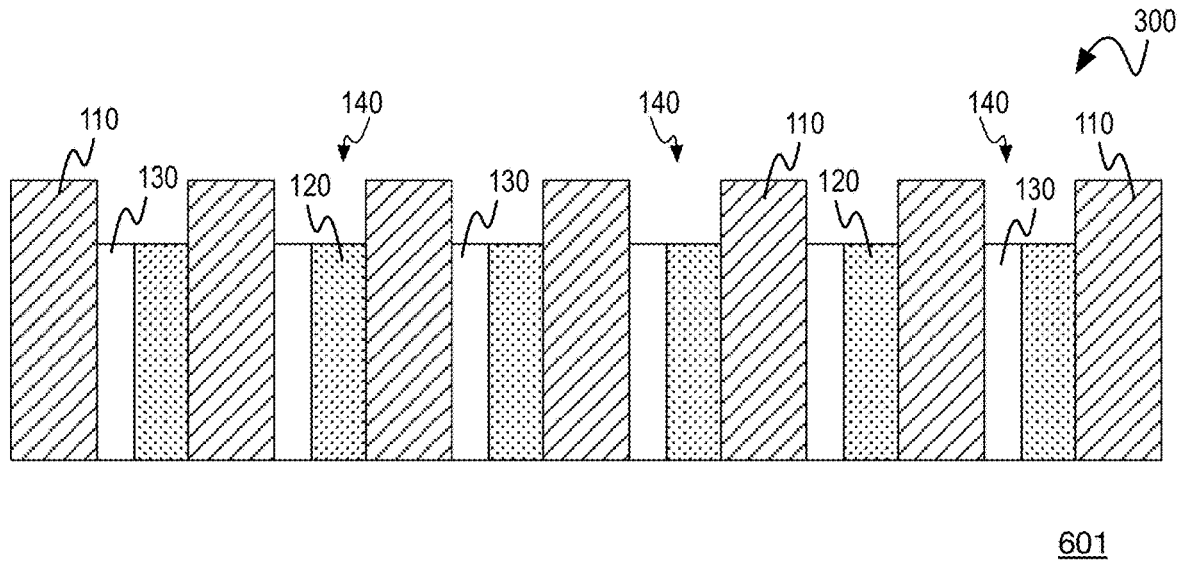
FIG. 7 illustrates a cross-sectional profile view of an IC die with square-profiled hanging recesses in heterogenous materials, in accordance with some embodiments.
Figure 7:
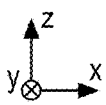

FIG. 7 illustrates a cross-sectional profile view of IC die 300 with square-profiled hanging recesses in heterogenous materials (e.g., outer materials 110, inner materials 120, and intervening materials 130), in accordance with some asymmetrical bi-layer embodiments. Although some previous embodiments included, e.g., metallization and contacts to transistor structures, uses for square-profiled recesses 140 of inner material 120 and intervening material 130 below and between materials 110 are not limited to these embodiments. In some embodiments, none of materials 110, inner materials 120, and intervening materials 130 include substantial portions of metal. In some such embodiments, inner materials 120 and intervening materials 130 are predominantly insulators, e.g., dielectric materials, and materials 110 include semiconductor materials. Depositions, e.g., epitaxial growth, may benefit from having well-controlled surfaces clear of unwanted materials. For example, these surfaces may serve as better seed layers for film growth and other depositions. In some embodiments, materials 110, inner materials 120, and intervening materials 130 are all predominantly insulators. Hence, the multi-etch process described herein may be applied to a wide variety of structures beyond those specifically illustrated as examples.

Figure 8:
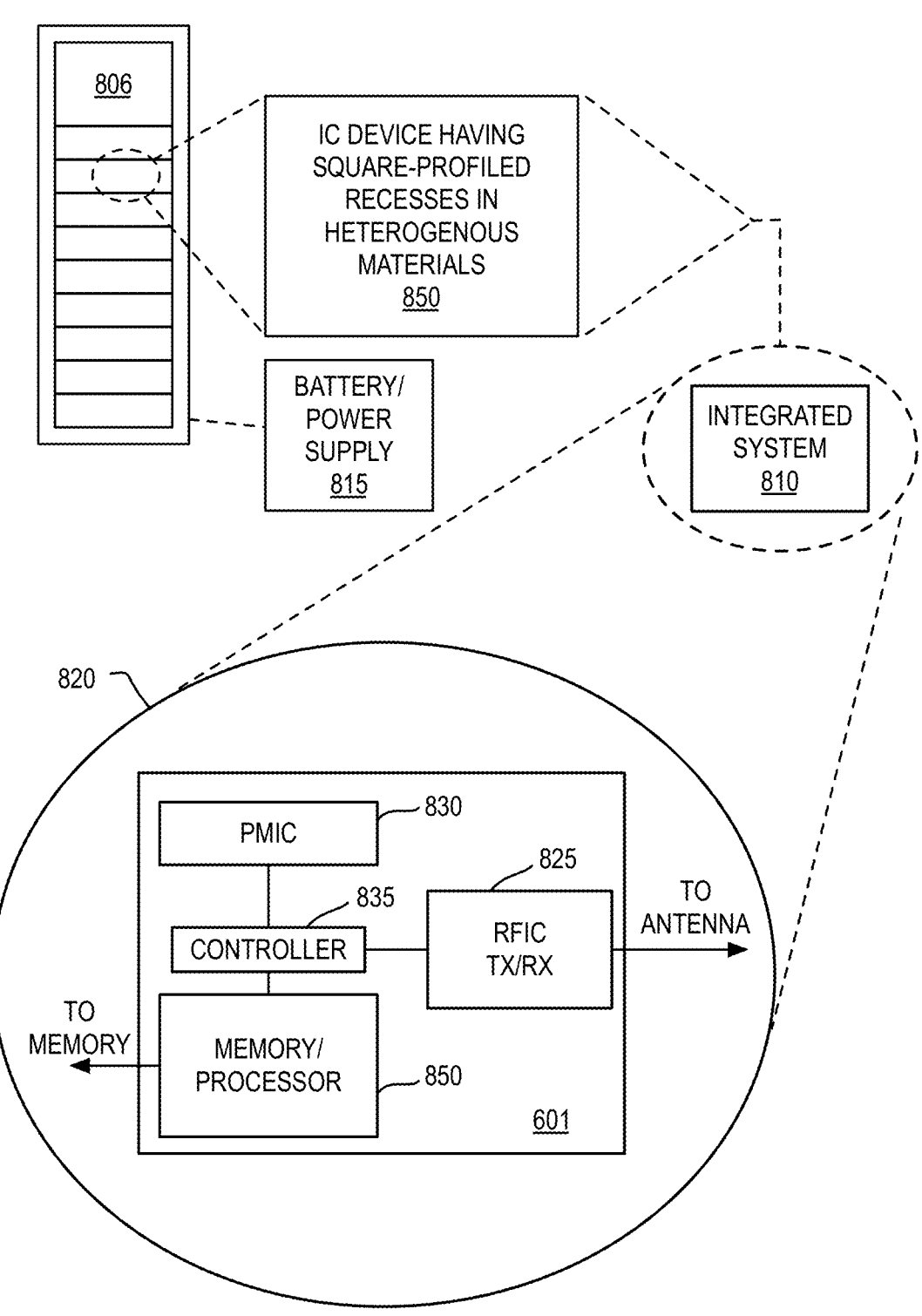
FIG. 8 illustrates a diagram of an example data server machine employing an IC device with square-profiled hanging recesses in heterogenous materials, in accordance with some embodiments.

FIG. 8 illustrates a diagram of an example data server machine 806 employing an IC device with square-profiled heterogenous materials, in accordance with some embodiments. Server machine 806 may be any commercial server, for example, including any number of high-performance computing platforms disposed within a rack and networked together for electronic data processing, which in the exemplary embodiment includes one or more devices 850 having square-profiled recesses in heterogenous materials.

Also as shown, server machine 806 includes a battery and/or power supply 815 to provide power to devices 850, and to provide, in some embodiments, power delivery functions such as power regulation. Devices 850 may be deployed as part of a package-level integrated system 810. Integrated system 810 is further illustrated in the expanded view 820. In the exemplary embodiment, devices 850 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 850 is a microprocessor including an SRAM cache memory. As shown, device 850 may be an IC device with square-profiled recesses in heterogenous materials as discussed herein. Device 850 may be further coupled to (e.g., communicatively coupled to) a board, an interposer, or a substrate 601 along with, one or more of a power management IC (PMIC) 830, RF (wireless) IC (RFIC) 825 including a wideband RF (wireless) transmitter and/or receiver (TX/RX) (e.g., including a digital baseband and an analog front end module further includes a power amplifier on a transmit path and a low noise amplifier on a receive path), and a controller 835 thereof. In some embodiments, RFIC 825, PMIC 830, controller 835, and device 850 include an IC device with square-profiled recesses in heterogenous materials.

FIG. 9 is a block diagram of an example computing device 900, in accordance with some embodiments. For example, one or more components of computing device 900 may include any of the devices or structures discussed herein. A number of components are illustrated in FIG. 9 as being included in computing device 900, but any one or more of these components may be omitted or duplicated, as suitable for the application. In some embodiments, some or all of the components included in computing device 900 may be attached to one or more printed circuit boards (e.g., a motherboard). In some embodiments, various ones of these components may be fabricated onto a single system-on-a-chip (SoC) die. Additionally, in various embodiments, computing device 900 may not include one or more of the components illustrated in FIG. 9, but computing device 900 may include interface circuitry for coupling to the one or more components. For example, computing device 900 may not include a display device 903, but may include display device interface circuitry (e.g., a connector and driver circuitry) to which display device 903 may be coupled. In another set of examples, computing device 900 may not include an audio output device 904, other output device 905, global positioning system (GPS) device 909, audio input device 910, or other input device 911, but may include audio output device interface circuitry, other output device interface circuitry, GPS device interface circuitry, audio input device interface circuitry, audio input device interface circuitry, to which audio output device 904, other output device 905, GPS device 909, audio input device 910, or other input device 911 may be coupled.

Computing device 900 may include a processing device 901 (e.g., one or more processing devices). As used herein, the term "processing device" or "processor" indicates a device that processes electronic data from registers and/or memory to transform that electronic data into other electronic data that may be stored in registers and/or memory. Processing device 901 may include a memory 921, a communication device 922, a refrigeration device 923, a battery/power regulation device 924, logic 925, interconnects 926 (i.e., optionally including redistribution layers (RDL) or metal-insulator-metal (MIM) devices), a heat regulation device 927, and a hardware security device 928.

Processing device 901 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 900 may include a memory 902, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 902 includes memory that shares a die with processing device 901. This memory may be used as cache memory and may include embedded dynamic random-access memory (eDRAM) or spin transfer torque magnetic random-access memory (STT-MRAM).

Computing device 900 may include a heat regulation/refrigeration device 906. Heat regulation/refrigeration device 906 may maintain processing device 901 (and/or other components of computing device 900) at a predetermined low temperature during operation.

In some embodiments, computing device 900 may include a communication chip 907 (e.g., one or more communication chips). For example, the communication chip 907 may be configured for managing wireless communications for the transfer of data to and from computing device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 907 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 907 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 907 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 907 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 907 may operate in accordance with other wireless protocols in other embodiments. Computing device 900 may include an antenna 913 to facilitate wireless communications and/or to receive other wireless communications (such as AM or FM radio transmissions).

In some embodiments, communication chip 907 may manage wired communications, such as electrical, optical, or any other suitable communication protocols (e.g., the Ethernet). As noted above, communication chip 907 may include multiple communication chips. For instance, a first communication chip 907 may be dedicated to shorter-range wireless communications such as Wi-Fi or Bluetooth, and a second communication chip 907 may be dedicated to longer-range wireless communications such as GPS, EDGE, GPRS, CDMA, WiMAX, LTE, EV-DO, or others. In some embodiments, a first communication chip 907 may be dedicated to wireless communications, and a second communication chip 907 may be dedicated to wired communications.

Computing device 900 may include battery/power circuitry 908. Battery/power circuitry 908 may include one or more energy storage devices (e.g., batteries or capacitors) and/or circuitry for coupling components of computing device 900 to an energy source separate from computing device 900 (e.g., AC line power).

Computing device 900 may include a display device 903 (or corresponding interface circuitry, as discussed above). Display device 903 may include any visual indicators, such as a heads-up display, a computer monitor, a projector, a touchscreen display, a liquid crystal display (LCD), a light-emitting diode display, or a flat panel display, for example.

Computing device 900 may include an audio output device 904 (or corresponding interface circuitry, as discussed above). Audio output device 904 may include any device that generates an audible indicator, such as speakers, headsets, or earbuds, for example.

Computing device 900 may include an audio input device 910 (or corresponding interface circuitry, as discussed above). Audio input device 910 may include any device that generates a signal representative of a sound, such as microphones, microphone arrays, or digital instruments (e.g., instruments having a musical instrument digital interface (MIDI) output).

Computing device 900 may include a GPS device 909 (or corresponding interface circuitry, as discussed above). GPS device 909 may be in communication with a satellite-based system and may receive a location of computing device 900, as known in the art.

Computing device 900 may include other output device 905 (or corresponding interface circuitry, as discussed above). Examples of the other output device 905 may include an audio codec, a video codec, a printer, a wired or wireless transmitter for providing information to other devices, or an additional storage device.

Computing device 900 may include other input device 911 (or corresponding interface circuitry, as discussed above). Examples of the other input device 911 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 900 may include a security interface device 912. Security interface device 912 may include any device that provides security measures for computing device 900 such as intrusion detection, biometric validation, security encode or decode, access list management, malware detection, or spyware detection.

Computing device 900, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-9. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, a method includes receiving a plurality of adjoining structures over a substrate, wherein the structures include first and second outer sidewalls including a first material, the outer sidewalls substantially parallel with each other, an inner material between the first and second outer sidewalls, and an intervening material between the first and second outer sidewalls, recessing, with a first etch, the inner material to a recess depth, and revealing a surface of the first or second outer sidewall to the recess depth by etching the intervening material with a second etch.

In one or more second embodiments, further to the first embodiments, the first etch includes a cyclical etch process.

In one or more third embodiments, further to the first or second embodiments, the second etch includes a non-cyclical etch.

In one or more fourth embodiments, further to the first through third embodiments, the second etch includes a hydrogen precursor.

In one or more fifth embodiments, further to the first through fourth embodiments, the first and second etch further include a fluorocarbon precursor.

In one or more sixth embodiments, further to the first through fifth embodiments, the first and second etches occur in a same processing chamber.

In one or more seventh embodiments, further to the first through sixth embodiments, the intervening material is a first intervening material, the inner material is between the first intervening material and a second intervening material, and the second etch is of the first and second intervening materials and reveals surfaces of the first and second outer sidewall to the recess depth.

In one or more eighth embodiments, further to the first through seventh embodiments, the inner material includes predominantly silicon and oxygen.

In one or more ninth embodiments, further to the first through eighth embodiments, the intervening material includes more carbon or more nitrogen than the inner material.

In one or more tenth embodiments, further to the first through ninth embodiments, the intervening material includes predominantly silicon and nitrogen.

In one or more eleventh embodiments, further to the first through tenth embodiments, the intervening material includes predominantly silicon and carbon.

In one or more twelfth embodiments, further to the first through eleventh embodiments, the first or second outer sidewall includes predominantly a metal.

In one or more thirteenth embodiments, an integrated circuit (IC) die includes first and second outer sidewalls substantially parallel with each other and extending to a first height over a substrate, and an inner material and an intervening material between the first and second outer sidewalls, wherein upper surfaces of the inner and intervening materials are substantially coplanar at a second height recessed from the first height.

In one or more fourteenth embodiments, further to the thirteenth embodiments, a lateral dimension of the substantially coplanar upper surfaces of the inner and intervening materials at the second height is less than 10 nm less than a lateral dimension between the first and second outer sidewalls at the first height.

In one or more fifteenth embodiments, further to the thirteenth or fourteenth embodiments, the inner material includes predominantly silicon and oxygen.

In one or more sixteenth embodiments, further to the thirteenth through fifteenth embodiments, the intervening material includes more carbon or more nitrogen than the inner material.

In one or more seventeenth embodiments, further to the thirteenth through sixteenth embodiments, the first or second outer sidewall includes predominantly a metal.

In one or more eighteenth embodiments, an integrated circuit (IC) die includes a first transistor with a first gate structure extending to a first height, a second transistor with a second gate structure extending to the first height, a source or drain between the first and second gate structures, and an inner material and an intervening material between sidewalls of the first and second gate structures, a surface of the inner and intervening materials substantially coplanar and at a second height below the first height.

In one or more nineteenth embodiments, further to the eighteenth embodiments, a lateral dimension of the substantially coplanar surface of the inner and intervening materials at the second height is less than 10 nm less than a lateral dimension between the sidewalls of the first and second gate structures at the first height.

In one or more twentieth embodiments, further to the eighteenth or nineteenth embodiments, the intervening material is a first intervening material, and a second intervening material is between the sidewalls.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. A method, comprising:

receiving a plurality of adjoining structures over a substrate, wherein the structures comprise:

first and second outer sidewalls comprising a first material, the outer sidewalls substantially parallel with each other;

an inner material between the first and second outer sidewalls; and an intervening material between the first and second outer sidewalls;

recessing, with a first etch, the inner material to a recess depth, wherein the first etch comprises a cyclical etch process; and revealing a surface of the first or second outer sidewall to the recess depth by etching the intervening material with a second etch, wherein the second etch comprises a non-cyclical etch.

2. The method of claim 1, wherein the second etch comprises a hydrogen precursor.

3. The method of claim 2, wherein the first and second etch further comprise a fluorocarbon precursor.

4. The method of claim 1, wherein the first and second etches occur in a same processing chamber.

5. The method of claim 1, wherein:

the intervening material is a first intervening material;

the inner material is between the first intervening material and a second intervening material; and the second etch is of the first and second intervening materials and reveals surfaces of the first and second outer sidewall to the recess depth.

6. The method of claim 1, wherein the inner material comprises predominantly silicon and oxygen.

7. The method of claim 1, wherein the intervening material comprises more carbon or more nitrogen than the inner material.

8. The method of claim 1, wherein the intervening material comprises predominantly silicon and nitrogen.

9. The method of claim 1, wherein the intervening material comprises predominantly silicon and carbon.

10. The method of claim 1, wherein the first or second outer sidewall comprises predominantly a metal.

11. A method, comprising:

receiving a plurality of adjoining structures over a substrate, wherein the structures comprise:

first and second outer sidewalls comprising a first material, the outer sidewalls substantially parallel with each other;

an inner material between the first and second outer sidewalls, wherein the inner material comprises predominantly silicon and oxygen; and an intervening material between the first and second outer sidewalls;

recessing, with a first etch, the inner material to a recess depth; and revealing a surface of the first or second outer sidewall to the recess depth by etching the intervening material with a second etch.

12. The method of claim 11, wherein the first or second outer sidewall comprises predominantly a metal.

13. The method of claim 12, wherein the intervening material comprises more carbon or more nitrogen than the inner material.

14. The method of claim 13, wherein the intervening material comprises predominantly silicon and nitrogen.

15. The method of claim 13, wherein the intervening material comprises predominantly silicon and carbon.

16. The method of claim 11, wherein the first etch comprises a cyclical etch process.

17. The method of claim 16, wherein the second etch comprises a non-cyclical etch.

18. A method, comprising:

receiving a plurality of adjoining structures over a substrate, wherein the structures comprise:

first and second outer sidewalls comprising a first material, the outer sidewalls substantially parallel with each other;

an inner material between the first and second outer sidewalls; and an intervening material between the first and second outer sidewalls;

recessing, with a first etch, the inner material to a recess depth; and revealing a surface of the first or second outer sidewall to the recess depth by etching the intervening material with a second etch, wherein the second etch comprises a hydrogen precursor.

19. The method of claim 18, wherein the first and second etch further comprise a fluorocarbon precursor.

20. The method of claim 18, wherein the first etch comprises a cyclical etch process and the second etch comprises a non-cyclical etch.

* * * * *